United States Patent
Kitazaki (10) Patent No.: US 11,545,613 B2
(45) Date of Patent: *Jan. 3, 2023

(54) PIEZOELECTRIC COMPOSITION AND PIEZOELECTRIC DEVICE

(71) Applicant: TDK Corporation, Tokyo (JP)

(72) Inventor: Masashi Kitazaki, Tokyo (JP)

(73) Assignee: TDK Corporation, Tokyo (JP)

(*) Notice: Subject to any disclaimer, the term of this patent is extended or adjusted under 35 U.S.C. 154(b) by 298 days.

This patent is subject to a terminal disclaimer.

(21) Appl. No.: 16/742,016

(22) Filed: Jan. 14, 2020

(65) Prior Publication Data

US 2020/0235282 A1 Jul. 23, 2020

(30) Foreign Application Priority Data

Jan. 22, 2019 (JP) .............................. JP2019-008618

(51) Int. Cl.
  *H01L 41/18* (2006.01)
  *H01L 41/187* (2006.01)
  *H01L 41/257* (2013.01)

(52) U.S. Cl.
  CPC ...... *H01L 41/1871* (2013.01); *H01L 41/1878* (2013.01); *H01L 41/257* (2013.01)

(58) Field of Classification Search
  CPC ............. H01L 41/1878; H01L 41/1871; H01L 41/1873; H01L 41/187; H01L 41/08;

(Continued)

(56) References Cited

U.S. PATENT DOCUMENTS 10,937,943 B2 * 3/2021 Ishizaki ............ C04B 35/63416
2014/0354738 A1 12/2014 Yabuta et al.

(Continued)

FOREIGN PATENT DOCUMENTS

| JP | 2013-191751 A | 9/2013 |
| JP | 2016-6859 A | 1/2016 |
| JP | 2018-152378 A | 9/2018 |

OTHER PUBLICATIONS

Yang et al., "Room-temperature magnetoelectric coupling in single-phase BaTiO3—BiFeO3 system", Jounal of Applied Physics, 113, pp. 144101-1 to 144101-5. (Year: 2013).*

(Continued)

*Primary Examiner* — Matthew E. Hoban
*Assistant Examiner* — Lynne Edmondson
(74) *Attorney, Agent, or Firm* — Faegre Drinker Biddle & Reath LLP (57) ABSTRACT

A piezoelectric composition comprises an oxide having a perovskite structure, wherein the oxide contains bismuth, barium, iron and titanium; the X-ray diffraction pattern of the piezoelectric composition after a polarization treatment has a first peak and a second peak in the range of the diffraction angle 2θ of 38.6° or more and 39.6° or less; the diffraction angle 2θ of the first peak is smaller than the diffraction angle 2θ of the second peak; an intensity of the first peak is represented as $I_L$; an intensity of the second peak is represented as $I_H$; and $I_H/I_L$ is 0.00 or more and 2.00 or less.

6 Claims, 6 Drawing Sheets (58) Field of Classification Search
CPC ....... H01L 41/37; H01L 41/43; H01L 41/257; H01L 21/31691; C04B 35/4682; C04B 35/475; C04B 35/63416; C04B 35/62695; C04B 2235/5436; C04B 2235/5445; C04B 2235/3236
USPC ......................................................... 310/311
See application file for complete search history.

(56) References Cited

U.S. PATENT DOCUMENTS

2015/0349239 A1  12/2015  Murakami et al.
2018/0261758 A1  9/2018  Kitazaki et al.

OTHER PUBLICATIONS

Yin Renqiang, "Study on Preparation and Properties of Bismuth Ferrite-based High-Temperature Lead-Free Piezoelectric Ceramics," Chinese Doctoral Dissertation & Master's Theses Full-text Database (Master), Engineering Science and Technology II, No. 3, Mar. 15, 2018, pp. 23-50 (relevance provided by English translation of CN Office Action cited below).

Huabin Yang et al., "Structural, microstructural and electrical properties of $BiFeO_3$—$BaTiO_3$ ceramics with high thermal stability," Materials Research Bulletin, vol. 47, Sep. 12, 2012, pp. 4233-4239.

English Translation of Office Action in Chinese Patent Application No. 202010008943.4 dated Oct. 15, 2021.

Cen, Zhenyong, et al., "Effect of sintering temperature on microstructure and piezoelectric properties of Pb-free $BiFeO_3$—$BaTiO_3$ ceramics in the composition range of large $BiFeO_3$ concentrations," Journal of Electroceramics (2013) 31, Springer Nature Switzerland AG, Mar. 15, 2013, pp. 15-20.

* cited by examiner

PIEZOELECTRIC COMPOSITION AND PIEZOELECTRIC DEVICE

TECHNICAL FIELD

The present invention relates to a piezoelectric composition and a piezoelectric device.

BACKGROUND

Most of piezoelectric compositions in practical use at present are solid solutions (so-called PZT piezoelectric compositions) consisting of lead zirconate ($PbZrO_3$) and lead titanate ($PbTiO_3$). The PZT piezoelectric compositions contain a large amount of lead oxide (PbO) as their main component. Since the lead oxide remarkably easily vaporizes at low temperatures, a large amount of the lead oxide diffuses into the air in production processes of piezoelectric compositions or piezoelectric devices using them. Since lead is an environmental pollutant harming human bodies, piezoelectric compositions containing no lead are demanded.

A typical piezoelectric composition containing no lead is bismuth ferrite ($BiFeO_3$) described in the following Non Patent Literature 1. Bismuth ferrite (BFO) presents with a large spontaneous polarization. However, since the anisotropy of BFO is high and a large leak current is liable to be generated in BFO, BFO does not have a sufficient piezoelectricity (for example, piezoelectric constant $d_{33}$). Therefore, piezoelectric compositions having a larger $d_{33}$ than BFO are demanded. For example, in the following Patent Literature 1, a ternary compound ($xBaTiO_3$-$yBiFeO_3$-$yBi(Mg_{0.5}Ti_{0.5})O_3$) composed of barium titanate, bismuth ferrite and bismuth magnesia titanate is disclosed. Further in the following Patent Literature 2, a binary compound ($Ba_{1-y}Bi_y)_a(Ti_{1-x-z}Zr_xFe_z)O_3$) composed of barium zirconate titanate and bismuth ferrite is disclosed.

CITATION LIST

Patent Literature 1

Japanese Unexamined Patent Publication No. 2013-191751

Patent Literature 2

Japanese Unexamined Patent Publication No. 2016-6859

Non Patent Literature 1

Zhenyong Cen et al., "Effect of sintering temperature on microstructure and piezoelectric properties of Pb-free $BiFeO_3$—$BaTiO_3$ ceramics in the composition range of large $BiFeO_3$ concentrations", J Electroceram, 31, p. 15-20, 2013.

SUMMARY

A piezoelectric composition described in the Patent Literature 1 is largely strained when a sufficiently large electric field is applied thereto. However, the piezoelectric composition described in the Patent Literature 1 has difficulty in having a sufficiently large piezoelectric constant ($d_{33}$) after being subjected to a polarization treatment. A piezoelectric composition described in the Patent Literature 2 has a large piezoelectric constant. However, the Curie temperature and the depolarization temperature of the piezoelectric composition described in the Patent Literature 2 are very low. Consequently, in a production process of a piezoelectric device using the piezoelectric composition, the piezoelectricity of the piezoelectric composition is easily impaired by heating of the piezoelectric composition. For example, the piezoelectricity of the piezoelectric composition is impaired by heating in soldering. Therefore, the piezoelectric composition described in the Patent Literature 2 cannot stand practical use. A piezoelectric composition described in the Non Patent Literature 1 also has difficulty in having a sufficiently large piezoelectric constant after being subjected to a polarization treatment.

The present invention has an object to provide a piezoelectric composition having a large piezoelectric constant, and a piezoelectric device comprising the piezoelectric composition.

A piezoelectric composition according to one aspect of the present invention is a piezoelectric composition comprising an oxide having a perovskite structure, wherein the oxide contains bismuth, barium, iron and titanium; an X-ray diffraction pattern of the piezoelectric composition after a polarization treatment has a first peak and a second peak in the range of the diffraction angle $2\theta$ of $38.6°$ or more and $39.6°$ or less; the diffraction angle $2\theta$ of the first peak is smaller than the diffraction angle $2\theta$ of the second peak; the intensity of the first peak is represented as $I_L$; the intensity of the second peak is represented as $I_H$; and $I_H/I_L$ is 0.00 or more and 2.00 or less.

At least part of the above oxide may be represented by $x[Bi_mFeO_3]$-$y[Ba_nTiO_3]$; x may be 0.6 or more and 0.8 or less; y may be 0.2 or more and 0.4 or less; x+y may be 1; m may be 0.96 or more and 1.06 or less; and n may be 0.96 or more and 1.06 or less.

m may be 1.02 or more and 1.05 or less; and n may be 1.02 or more and 1.05 or less.

At least part of the oxide may be a rhombohedral crystal.

A piezoelectric composition according to one aspect of the present invention may comprise a rhombohedral crystal of an oxide containing bismuth and iron.

A piezoelectric device according to one aspect of the present invention comprises the above piezoelectric composition.

According to the present invention, there are provided a piezoelectric composition having a large piezoelectric constant, and a piezoelectric device comprising the piezoelectric composition.

DETAILED DESCRIPTION

Hereinafter, preferred embodiments of the present invention will be described with reference to the drawings. The present invention is not any more limited to the following embodiments.

Figure 1:
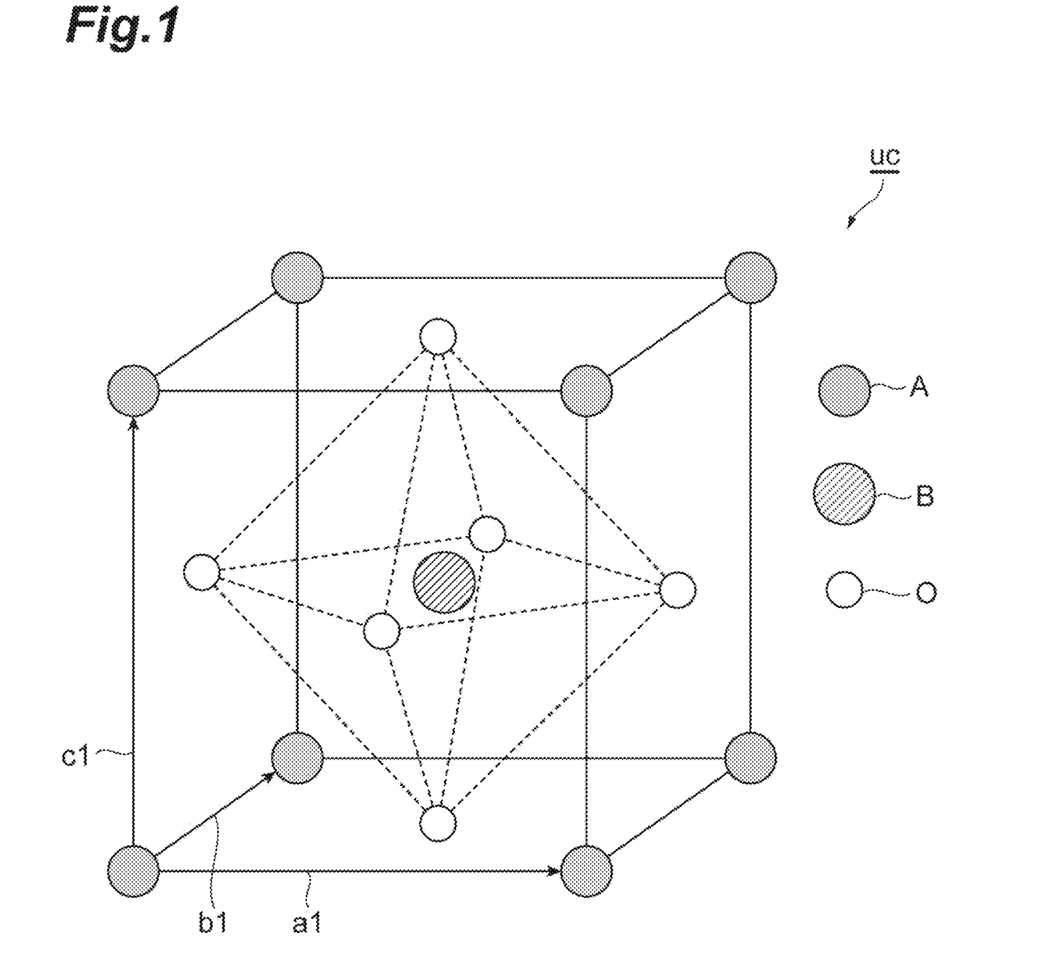
FIG. 1 is a perspective view of a unit cell of a perovskite structure of an oxide contained in a piezoelectric composition according to one embodiment of the present invention.
Figure 2:
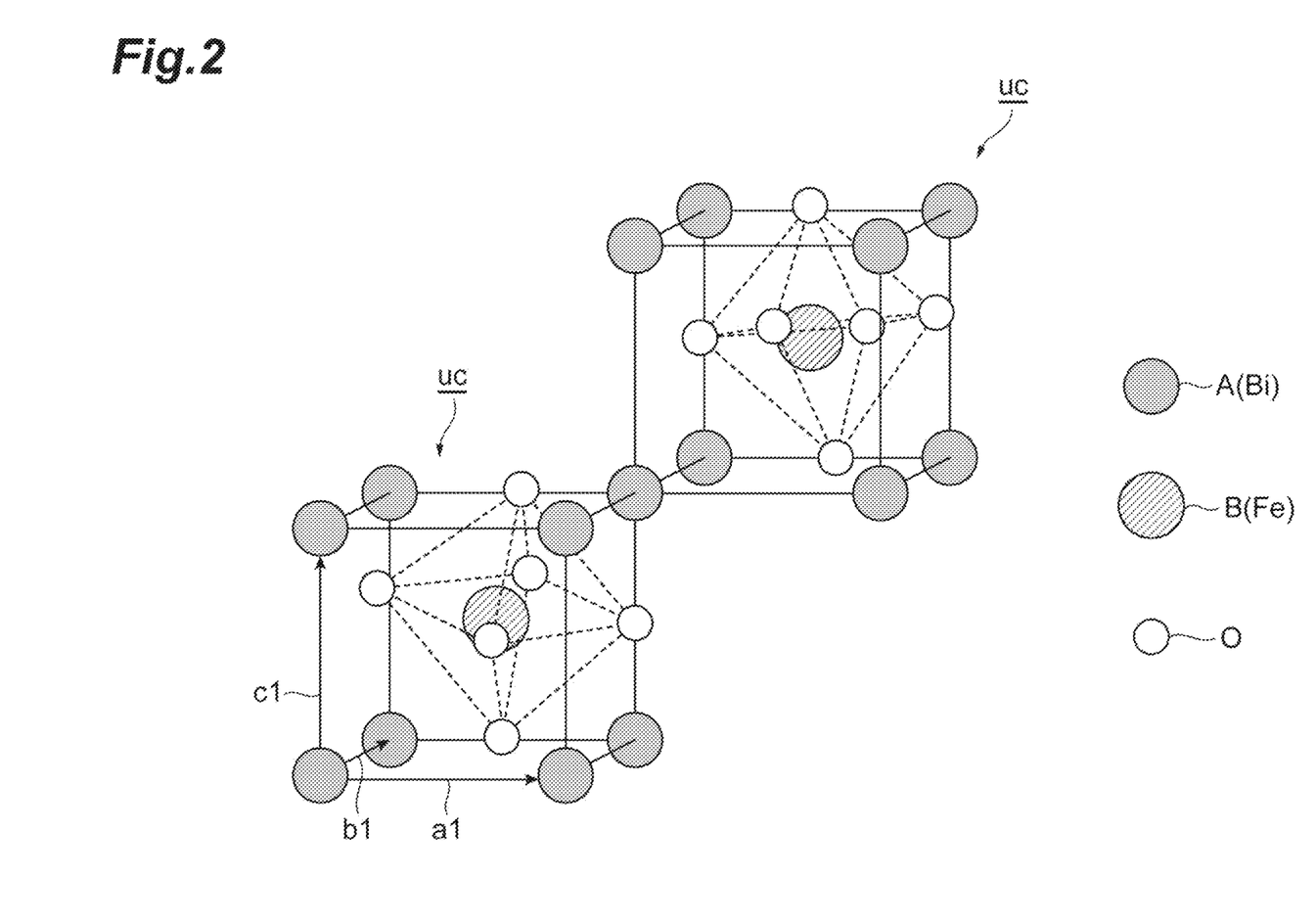
FIG. 2 is a perspective view of a rhombohedral crystal of an oxide contained in the piezoelectric composition according to one embodiment of the present invention.
Figure 3:
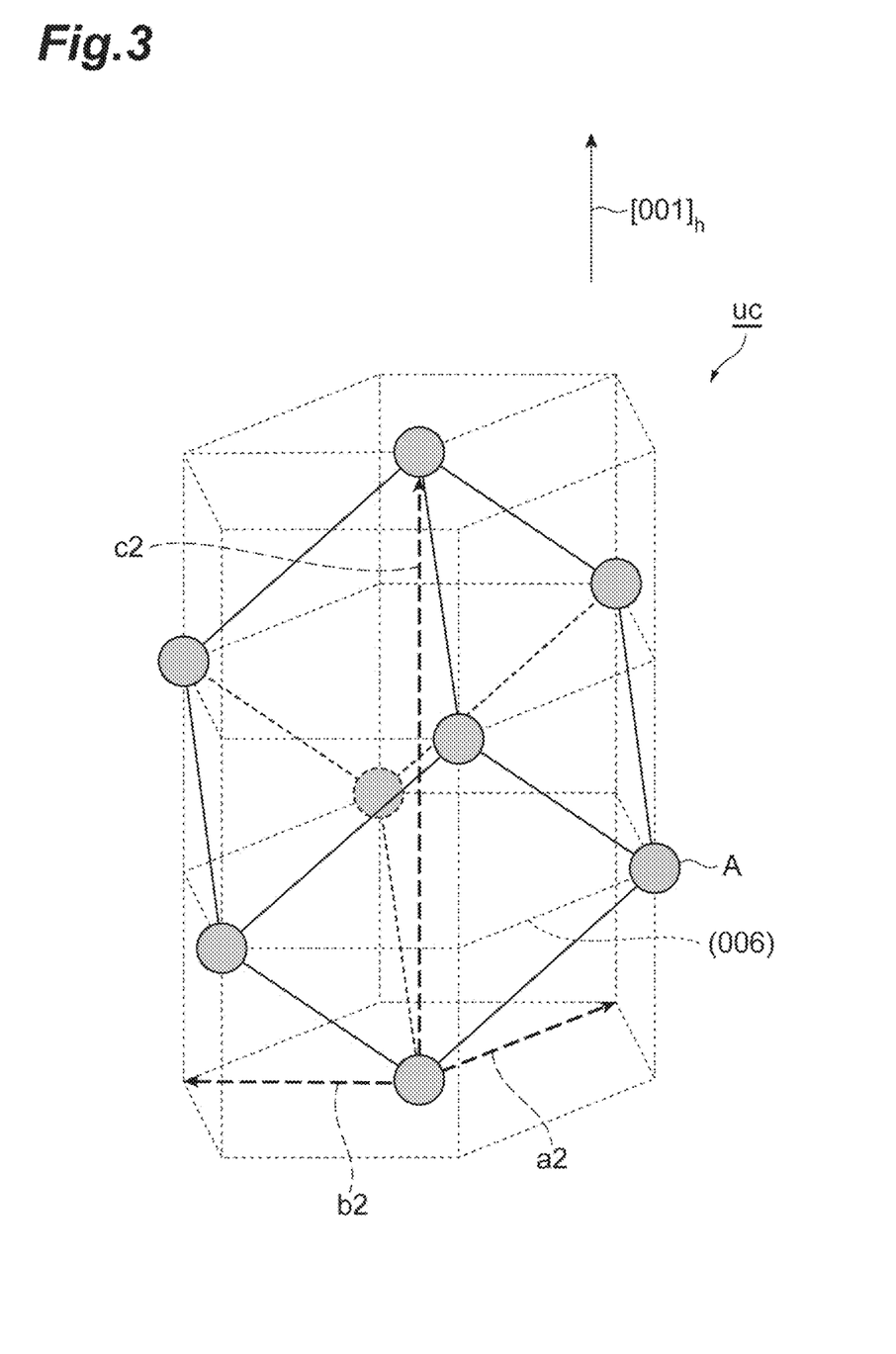
FIG. 3 is a perspective view of a unit cell constituting the rhombohedral crystal illustrated in FIG. 2.

A piezoelectric composition according to the present embodiment comprises an oxide containing bismuth (Bi), barium (Ba), iron (Fe) and titanium (Ti). For the convenience of description, the oxide containing Bi, Ba, Fe and Ti is represented as "BFO-BTO". The BFO-BTO has a perovskite structure. The BFO-BTO may contain at least one crystal selected from the group consisting of a rhombohedral crystal of the perovskite structure, a tetragonal crystal of the perovskite structure and a cubic crystal of the perovskite structure. One example of a unit cell of the perovskite structure is shown in FIG. 1. The unit cell uc of the perovskite structure may consist of elements A positioned on A sites, an element B positioned on the B site, and oxygen (O). The elements A may be Bi or Ba. The element B may be Fe or Ti. One example of the rhombohedral crystal of BFO-BTO is illustrated in FIG. 2. Unit cells uc constituting the rhombohedral crystal in FIG. 2 each correspond to a unit cell uc in FIG. 3. For the convenience of figure drawing, elements B and O are omitted in FIG. 3. a1, b1 and c1 in FIG. 1 and FIG. 2 are primitive vectors constituting a cubic crystal or a tetragonal crystal. a2, b2 and c2 in FIG. 3 are primitive vectors constituting a rhombohedral crystal. The [111] (crystal orientation) based on a1, b1 and c1 corresponds to the $[001]_h$ based on a2, b2 and c2. As illustrated in FIG. 2, the rhombohedral crystal of the perovskite structure may have an antiferromagnetic strain displacement like $BiFeO_3$. As illustrated in FIG. 2, the rhombohedral crystal may be constituted of two unit cells uc periodically arrayed along the [111]. The piezoelectric composition may have spontaneous polarization. That is, the piezoelectric composition may be a pyroelectric material or a ferroelectric material.

The X-ray diffraction pattern of the piezoelectric composition after a polarization treatment has a first peak and a second peak in the range of the diffraction angle 2θ of 38.6° or more and 39.6° or less. The polarization treatment means that the piezoelectric composition is polarized along an electric field by applying the electric field to the piezoelectric composition. The diffraction angle 2θ of the first peak is smaller than the diffraction angle 2θ of the second peak. For example, the diffraction angle 2θ of the first peak may be about 38.851°. For example, the diffraction angle 2θ of the second peak may be about 39.177°. The incident X-ray to be used for measurement of the X-ray diffraction pattern may be a CuKα1 line. The intensity of the first peak is represented as $I_L$, and the intensity of the second peak is represented as $I_H$. $I_H/I_L$ is 0.00 or more and 2.00 or less. The unit of $I_L$ and $I_H$ may be an arbitrary unit (a.u.). The piezoelectric composition containing BFO-BTO and having an $I_H/I_L$ of 0.00 or more and 2.00 or less can have a large piezoelectric constant ($d_{33}$). The respective diffraction angles 2θ of the first peak and the second peak are not limited to the above values, and may vary depending on the composition of the BFO-BTO.

The diffraction angle 2θ of the intensity of the first peak is approximately equal to a diffraction angle 2θ of diffracted X-rays of the (006) planes of a rhombohedral crystal of bismuth ferrite (BFO). The diffraction angle 2θ of the intensity of the second peak is approximately equal to a diffraction angle 2θ of diffracted X-rays of the (202) planes of the rhombohedral crystal of bismuth ferrite. Therefore, there is such possibility that part of or the whole of the oxide (BFO-BTO) contained in the piezoelectric composition is the same rhombohedral crystal as bismuth ferrite. That is, there is such possibility that part of or the whole of the oxide (BFO-BTO) contained in the piezoelectric composition has a perovskite structure of the bismuth ferrite type. The corresponding relation between the diffraction angle 2θ of the diffracted X-rays of bismuth ferrite and the crystal plane may be specified, for example, by using Code No. 194991 of Inorganic Crystal Structure Database (ICSD). The orientation of the spontaneous polarization in the rhombohedral crystal of bismuth ferrite is $[001]_h$, and the normal direction of the (006) planes. That is, the more the (006) planes are oriented in one direction, the more easily the bismuth ferrite is polarized along the $[001]_h$. Similarly, the orientation of the spontaneous polarization in the rhombohedral crystal of BFO-BTO is also $[001]_h$, and the normal direction of the (006) planes. Therefore, the higher the intensity $I_L$ of the first peak corresponding to diffracted X-rays of the (006) planes, the more the (006) planes face the spontaneous polarization orientation and the more easily the piezoelectric composition is polarized. For example, in the case where the thickness of the piezoelectric composition is uniform and the first peak is measured by an out-of-plane measurement (2θ/θ method) at the surface of the piezoelectric composition perpendicular to the thickness direction, the higher the $I_L$, the more the (006) planes are approximately parallel to the surface of the piezoelectric composition and the more easily the piezoelectric composition is polarized in its thickness direction ($[001]_h$). On the other hand, the rhombohedral crystal of bismuth ferrite is hardly polarized in $[101]_h$. That is, the rhombohedral crystal of bismuth ferrite is hardly polarized in the normal direction of the (202) planes. Similarly, the rhombohedral crystal of BFO-BTO is also hardly polarized in the normal direction of the (202) planes. Therefore, the higher the intensity $I_H$ of the second peak corresponding to diffracted X-rays of the (202) planes, the greater the number of the (202) planes not contributing to the spontaneous polarization and the more hardly the piezoelectric composition is polarized. For the above reason, as the $I_L$ is relatively higher than the $I_H$, the piezoelectric composition is more easily polarized and the piezoelectric constant ($d_{33}$) of the piezoelectric composition increases. Then, the piezoelectric composition can have a sufficiently large piezoelectric constant when $I_H/I_L$ is 0.00 or more and 2.00 or less. For the same reason, $I_H/I_L$ may be preferably 0.00 or more and 1.50 or less, and more preferably 0.00 or more and 1.00 or less. Since the piezoelectric composition easily has a sufficiently large piezoelectric constant, part of or the whole of the oxide (BFO-BTO) may be the rhombohedral crystal.

The reason why the piezoelectric composition has a large piezoelectric constant ($d_{33}$) is not necessarily limited to the above mechanism.

At least part of the oxide (BFO-BTO) may be represented by Chemical Formula 1. Chemical Formula 1 may be equal to Chemical Formula 2.

$$x[Bi_mFeO_3]\text{-}y[Ba_nTiO_3] \quad (1)$$

$$(Bi_{xm}Ba_{yn})(Fe_xTi_y)O_3 \quad (2)$$

x+y is 1. x may be 0.6 or more and 0.9 or less, and preferably 0.6 or more and 0.8 or less. y may be 0.1 or more and 0.4 or less, and preferably 0.2 or more and 0.4 or less. m may be 0.93 or more and 1.07 or less, preferably 0.96 or more and 1.06 or less, and more preferably 1.02 or more and 1.05 or less. n may be 0.93 or more and 1.07 or less, preferably 0.96 or more and 1.06 or less, and more preferably 1.02 or more and 1.05 or less. Chemical Formula 1 means that the composition of the oxide contained in the piezoelectric composition is represented by the sum of two phases of a rhombohedral crystal of bismuth ferrite (BFO) and a tetragonal crystal of barium titanate (BTO). The composition in which these two phases coexist easily has morphotropic phase boundaries (MPB). Consequently, the polarization rotation is easily caused in the piezoelectric composition, and the piezoelectric composition easily has a large piezoelectric constant ($d_{33}$). Further in the case where the oxide contained in the piezoelectric composition is represented by the Chemical Formula 1, the piezoelectric composition easily has a high depolarization temperature.

In the case where m and n are in the above ranges, since a heterophase having no piezoelectricity is hardly formed in the piezoelectric composition, the piezoelectric constant easily increases. Particularly in the case where m is 1.02 or more and 1.05 or less and n is 1.02 or more and 1.05 or less, deficiencies of Bi and Ba at A sites of the perovskite structure hardly occur, and the crystallinity of the perovskite structure is improved. Since deficiencies of Bi and Ba inhibit the movement of domains, by suppressing the deficiencies of Bi and Ba to improve the crystallinity of the perovskite structure, the domain pinning is suppressed and domains in the piezoelectric composition are easily inverted. Consequently, the piezoelectric constant easily increases.

The piezoelectric composition may consist only of one oxide consisting of Bi, Fe, Ba, Ti and O. Part of the piezoelectric composition may be a phase consisting of $Bi_mFeO_3$. Since the piezoelectric composition easily has a sufficiently large piezoelectric constant ($d_{33}$), the piezoelectric composition may contain a rhombohedral crystal of the oxide containing bismuth and iron. For example, part of the piezoelectric composition may also be a rhombohedral crystal of $Bi_mFeO_3$. Part of the piezoelectric composition may also be a phase consisting of $Ba_nTiO_3$. The piezoelectric composition may contain elements other than Bi, Fe, Ba, Ti and O as additives or impurities. For example, the piezoelectric composition may further contain at least one element selected from the group consisting of silver (Ag), vanadium (V), niobium (Nb), tantalum (Ta), molybdenum (Mo), tungsten (W) and manganese (Mn). By making the piezoelectric composition to contain these elements, the electric resistivity ($\rho$) of the piezoelectric composition is easily raised and the leak current in the piezoelectric composition is easily suppressed. Therefore, a high voltage is easily applied to the piezoelectric composition; the piezoelectric composition is easily sufficiently polarized; and the piezoelectric composition easily has a large piezoelectric constant. The piezoelectric composition may contain, as additives or impurities, at least one selected from the group consisting of sodium (Na), potassium (K), magnesium (Mg), aluminum (Al), sulfur (S), zirconium (Zr), silicon (Si), phosphorus (P), copper (Cu), zinc (Zn) and hafnium (Hf). The piezoelectric composition according to the present embodiment may not contain Pb. However, the piezoelectric composition containing Pb is not necessarily excluded from the technical scope of the present embodiment.

The average composition of the whole piezoelectric composition may be analyzed, for example, by an X-ray fluorescence analysis method (XRF method) or an inductively coupled plasma (ICP) atomic emission spectroscopy. The structure of the piezoelectric composition may be specified by an X-ray diffraction (XRD) method.

The $d_{33}$ of the piezoelectric composition after a polarization treatment may be, for example, 102 pC/N or more and 250 pC/N or less. The depolarization temperature of the piezoelectric composition may be, for example, 200° C. or more and 643° C. or less.

Figure 4:
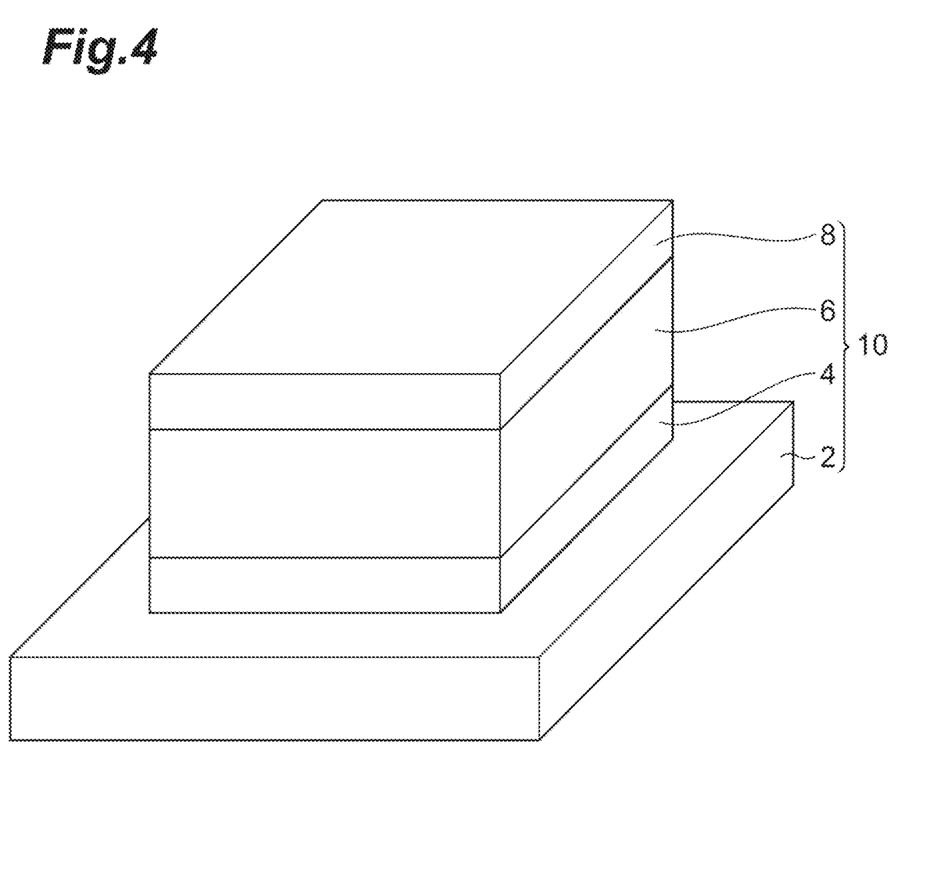
FIG. 4 is a schematic perspective view of a piezoelectric device according to one embodiment of the present invention.

As illustrated in FIG. 4, a piezoelectric device 10 according to the present embodiment comprises a substrate 2, a first electrode 4 stacked on the surface of the substrate 2, a piezoelectric body 6 stacked on the surface of the first electrode 4, and a second electrode 8 stacked on the surface of the piezoelectric body 6. The piezoelectric body 6 contains the above piezoelectric composition according to the present embodiment. The piezoelectric body 6 may be a sintered body of the piezoelectric composition. The piezoelectric body 6 may contain other components in addition to the piezoelectric composition. Although the piezoelectric body 6 illustrated in FIG. 4 is a thin rectangular parallelepiped, the shape and dimension of the piezoelectric body 6 are not limited. The substrate 2 may be, for example, of a metal, a semiconductor, a resin or a ceramic. The compositions of the first electrode 4 and the second electrode 8 are not limited as long as they have electroconductivity. The first electrode 4 and the second electrode 8 each may be a simple substance of a metal or an alloy. The first electrode 4 and the second electrode 8 each may also be a metal oxide having electroconductivity. The structure of the piezoelectric device 10 according to the present embodiment is not limited to the structure illustrated in FIG. 4.

Applications of the piezoelectric device according to the present embodiment are diverse. The piezoelectric device may be, for example, a piezoelectric microphone, a sonar, an ultrasonic detector, a ceramic filter, a piezoelectric transformer, a harvester, a piezoelectric buzzer, an ultrasonic motor, an oscillator, a resonator, or an acoustic multilayer film. The piezoelectric device may be, for example, a piezoelectric actuator. The piezoelectric actuator may be used for haptics. That is, the piezoelectric actuator may be used for various devices required to feedback based on cutaneous sensation (tactile sensation). The devices required to feedback based on cutaneous sensation may be, for example, wearable devices, touch pads, displays or game controllers. The piezoelectric actuator may be used for head assemblies, head stack assemblies or hard disc drives. The piezoelectric actuator may be used for printer heads or inkjet printer apparatuses. The piezoelectric actuator may be used for piezoelectric switches. The piezoelectric device may be, for example, a piezoelectric sensor. The piezoelectric sensor may be used for gyro sensors, pressure sensors, AE (acoustic emission) sensors, pulse wave sensors, ultrasonic sensors, acceleration sensors or shock sensors. The each abovementioned piezoelectric device may be part of or the whole of a microelectromechanical system (MEMS).

The piezoelectric composition according to the present embodiment may be produced by the following production method.

In production of the piezoelectric composition, a raw material powder (raw material particles) is prepared from starting materials. A green compact is formed by press molding of the raw material particles. A sintered body is obtained by sintering of the green compact. A piezoelectric body is obtained by subjecting the sintered body to a polarization treatment. The piezoelectric composition according to the present embodiment means both of the sintered body before the polarization treatment and the sintered body after the polarization treatment. The details of each step are as follows.

In a granulation step, the starting materials for the piezoelectric composition are weighed. A plurality of kinds of the starting materials may be used. The starting materials contain Bi, Fe, Ba and Ti. The starting materials each may be a simple substance (metal) or a compound of the each element. The compound may be, for example, an oxide, a carbonate salt, a hydroxide, an oxalate salt, a nitrate salt, or the like. The starting materials each may be a solid (for example, a powder). By weighing the each starting material, the molar ratios of Bi, Fe, Ba and Ti in the whole of the starting materials may be adjusted to the molar ratios of Bi, Fe, Ba and Ti in Chemical Formula 1.

A bismuth compound may be bismuth oxide ($Bi_2O_3$), bismuth nitrate ($Bi(NO_3)_3$), or the like. An iron compound may be iron oxide ($Fe_2O_3$), iron chloride ($FeCl_3$), iron nitrate ($Fe(NO_3)_3$) or the like. A barium compound may be barium oxide (BaO), barium carbonate ($BaCO_3$), barium oxalate ($BaC_2O_4$), barium acetate (($CH_3COO)_2Ba$), barium nitrate ($Ba(NO_3)_2$), barium sulfate ($BaSO_4$), barium titanate ($BaTiO_3$) or the like. A titanium compound may be titanium oxide ($TiO_2$) or the like.

In the granulation step, raw material particles are prepared from the above-mentioned starting materials. A plurality of kinds of raw material particles having different compositions may be prepared. A preparation method of the raw material particles may be, for example, as follows.

A slurry may be prepared by mixing the starting materials and a solvent. The starting materials in the slurry may be pulverized by wet mixing of the slurry using a ball mill or the like. The solvent to be used for the preparation of the slurry may be, for example, water. The solvent may also be an alcohol such as ethanol. The solvent may be a mixture of water and ethanol. The starting materials after the wet mixing may be dried by a spray drier or the like.

A temporarily green compact is formed by molding the mixture of the pulverized starting materials. A temporarily sintered body is obtained by heating (calcining) the temporarily green compact in an oxidative atmosphere. The oxidative atmosphere may be, for example, the air. The calcination temperature may be 700° C. or more and 1050° C. or less. The calcination time may be about 1 to 3 hours. Raw material particles are obtained by pulverizing the temporarily sintered body. A slurry may be prepared by mixing the raw material particles and a solvent. The raw material particles in the slurry may be pulverized by wet mixing of the slurry using a ball mill or the like. The average value of the primary particle diameter of the raw material particles may be adjusted in the wet mixing. The average value of the primary particle diameter of the raw material particles may be, for example, 0.01 μm or more and 20 μm or less. The raw material particles after the wet mixing may be dried by a spray drier or the like.

A green compact is obtained by press molding of a mixture of the raw material particles and a binder. The binder may be an organic binder such as polyvinyl alcohol or ethylcellulose. A dispersant may be added to the binder.

In a sintering step, a sintered body is obtained by sintering the green compact in an oxidative atmosphere. Before the sintering of the green compact, a debindering treatment of the green compact may be carried out. That is, the binder in the green compact may be decomposed by heating of the green compact. The debindering treatment and the sintering may be carried out continuously. The debindering treatment and the sintering may be carried out separately.

Figure 5:
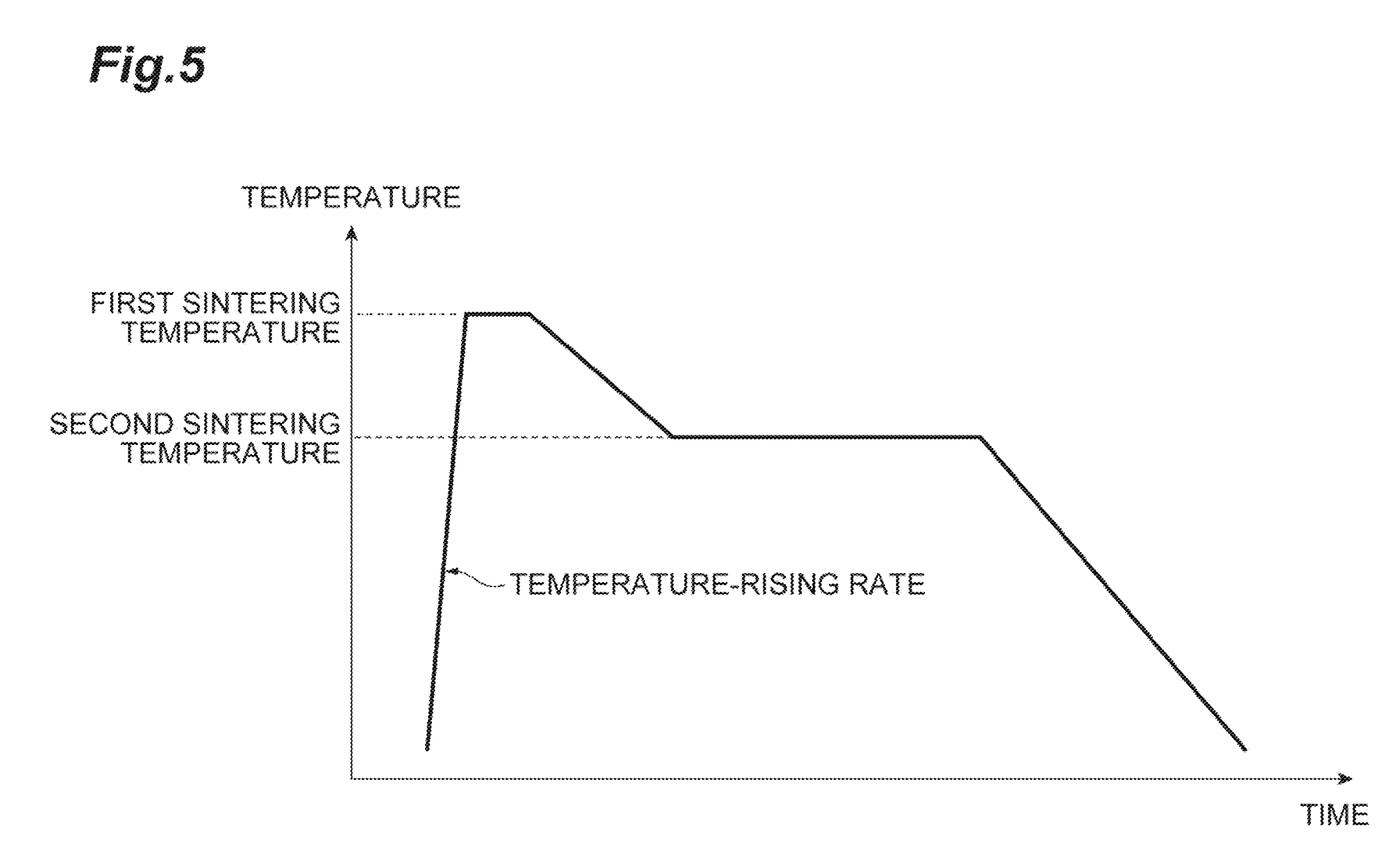
FIG. 5 is a profile of the temperature in a production process (sintering step) of the piezoelectric composition according to one embodiment of the present invention.

As shown in FIG. 5, in the sintering step, it is preferable that the green compact is heated in two steps. That is, it is preferable that the sintering step comprises a first sintering process and a second sintering process following the first sintering process. It is preferable that the green compact is heated at a first sintering temperature in the first sintering process; it is preferable that the green compact is heated at a second sintering temperature in the second sintering process; and it is preferable that the first sintering temperature is higher than the second sintering temperature. By heating the green compact in the two steps in the sintering step, the piezoelectric composition having a large piezoelectric constant ($d_{33}$) and a high depolarization temperature is easily obtained. It is preferable that the temperature-rising rate of the first sintering process is 15° C./min or more and 1000° C./min or less. The temperature-rising rate of the first sintering process is a temperature-rising rate at which the temperature of the green compact is raised from room temperature up to the first sintering temperature in the first sintering process. It is preferable that the first sintering temperature is 1100° C. or more and 1300° C. or less. It is preferable that the second sintering temperature is 900° C. or more and 1000° C. or less. In the case where the temperature-rising rate of the first sintering process, and the first sintering temperature and the second sintering temperature are in the above ranges, the piezoelectric composition having a large piezoelectric constant and a high depolarization temperature is easily obtained. The time of the first sintering process may be, for example, 0.5 hour or more and 2 hours or less. The time of the second sintering process may be, for example, 2 hours or more and 32 hours or less. After the sintering step, the sintered body may be annealed at a temperature lower than that of the second sintering process.

In advance to a polarization treatment described later, a thin plate consisting of the sintered body may be formed by cutting of the sintered body. The surface of the thin plate of the sintered body may be subjected to lap polishing. For the cutting of the sintered body, a cutting machine, such as a cutter, a slicer or a dicing saw, may be used. After the lap polishing, a temporary electrode for the polarization treatment is formed on each of the pair of opposing surfaces of the sintered body. The temporary electrodes may be formed by a vacuum deposition method or sputtering. The temporary electrodes are easily removed by an etching treatment using a ferric chloride solution or the like.

In the polarization treatment, a polarization electric field is applied between the pair of temporary electrodes interposing the sintered body. In the polarization treatment, the sintered body may be heated. The temperature of the sintered body in the polarization treatment may be 80° C. or more and 300° C. or less. The time of the application of the polarization electric field may be 1 min or more and 30 min or less. The polarization electric field may be not less than 0.9 times the coercive field of the sintered body.

After the polarization treatment, the temporary electrodes are removed from the sintered body. A piezoelectric composition (piezoelectric body) having a desired shape may be formed by processing of the sintered body.

Hitherto, preferred embodiments of the present invention have been described, but the present invention is not necessarily any more limited to the above-mentioned embodiments. For example, the piezoelectric composition according to the present invention may be a piezoelectric thin film.

EXAMPLES

Hereinafter, the present invention will be described in detail by way of Examples and Comparative Examples. The present invention, however, is not limited to the following Examples.

Example A1

As starting materials, a powder of $Bi_2O_3$, a powder of $Fe_2O_3$, a powder of $BaCO_3$ and a powder of $TiO_2$ were used.

The BaCO₃, TiO₂, Bi₂O₃ and Fe₂O₃ were weighed so that the molar ratios of Bi, Fe, Ba and Ti in the whole of the starting materials coincided with the molar ratios of Bi, Fe, Ba and Ti in the following Chemical Formula 1. In the case of Example A1, values of x, y, m and n in the Chemical Formula 1 were values shown in the following Table 1.

$$x[Bi_mFeO_3]\text{-}y[Ba_nTiO_3] \quad (1)$$

All the starting materials and pure water were mixed for 10 hours by a ball mill. The starting materials after the mixing were dried, and thereafter the starting materials were press molded to obtain a temporarily green compact. The temporarily green compact was heated at 800° C. to obtain a temporarily sintered body. The temporarily sintered body was pulverized by a ball mill. The pulverized temporarily sintered body was dried to obtain raw material particles. A mixture of the raw material particles and a binder (polyvinyl alcohol) was press molded to obtain a green compact. The binder was removed by heating of the green compact.

After the debindering treatment, a sintered body was obtained by the following sintering step.

As the sintering step, a first sintering process and a second sintering process following the first sintering process were carried out. In the first sintering process, the temperature of the green compact was raised up from room temperature to a first sintering temperature at a temperature-rising rate $V_T$. hi the first sintering process, the green compact was heated in the air at the first sintering temperature $T_{S1}$. The time of the first sintering process was 1 hour. In the second sintering process, the green compact was heated at a second sintering temperature $T_{S2}$. The time of the second sintering process was 10 hours. The temperature-rising rate $V_T$, the first sintering temperature $T_{S1}$ and the second sintering temperature $T_{S2}$ of Example A1 are shown in the following Table 1.

The sintered body was processed by using a double side lapping machine and a dicing saw to form a plate consisting of the sintered body. The dimension of the sintered body after the processing was 16 mm in length×16 mm in width× 0.5 mm in thickness.

Electrodes consisting of Ag were formed on both surfaces of the sintered body by using a vacuum deposition apparatus. The thickness of the each electrode was 1.5 μm. The dimension of the each electrode was 15 mm×15 mm.

An electric field was applied to the sintered body interposed between the pair of the electrodes to polarize the sintered body. The intensity of the electric field applied to the sintered body was 1.5 to 2 times the coercive field. The electric field was applied to the sintered body for 15 min. The above polarization treatment was carried out in a silicone oil bath of a temperature of 120° C.

By the above method, a piezoelectric composition of Example A1 was obtained. As a result of analysis based on an X-ray fluorescence analysis method, the molar ratios of Bi, Fe, Ba and Ti in the piezoelectric composition coincided with the molar ratios of Bi, Fe, Ba and Ti in the Chemical Formula 1. That is, the values of x, y, m and n in Chemical Formula 1 coincided with values shown in the following Table 1.

An X-ray diffraction pattern was measured by an out-of-plane measurement (2θ/θ method) at the surface of the piezoelectric composition after the polarization treatment. In the measurement of the X-ray diffraction pattern, Cu was used as a target of the X-ray source, and a characteristic X-ray of Cu was made to be incident on the surface of the piezoelectric composition. The surface of the piezoelectric composition at which the X-ray diffraction pattern was measured was perpendicular to the polarization direction. The polarization direction is a direction of a direct-current electric field in the polarization treatment. By processing the measured X-ray diffraction pattern by software, peaks of diffracted X-rays originated from a CuKα2 line were removed from the X-ray diffraction pattern. That is, an X-ray diffraction pattern originated from a CuKα1 line was extracted from the measured X-ray diffraction pattern. The wavelength of the CuKα1 line is 1.540593 Å. An X-ray diffraction pattern described in the below means an X-ray diffraction pattern originated from the CuKα1 line. By the X-ray diffraction pattern, it was confirmed that the piezoelectric composition had a perovskite structure. The X-ray diffraction pattern had a first peak and a second peak in the range of the diffraction angle 2θ of 38.6° or more and 39.6° or less. The diffraction angle 2θ of the first peak was smaller than the diffraction angle 2θ of the second peak. The diffraction angle 2θ of the intensity of the first peak was about 38.909°. The diffraction angle 2θ of the intensity of the second peak was about 39.367°. $I_H/I_L$ was calculated from the intensity $I_L$ of the first peak and the intensity $I_H$ of the second peak. The $I_H/I_L$ of Example A1 is shown in the following Table 1.

The piezoelectric constant $d_{33}$ (unit: pC/N) of the piezoelectric composition after the polarization treatment was measured by using a $d_{33}$ meter. The $d_{33}$ meter is an instrument to measure $d_{33}$ by the Berlincourt method according to JIS (Japanese Industrial Standards) R1696. In the Berlincourt method, $d_{33}$ is measured by utilizing the direct piezoelectric effect when vibration is imparted to a piezoelectric composition. Hence, in the Berlincourt method, unlike a measurement method utilizing the inverse piezoelectric effect when an electric field is applied to a piezoelectric composition, there is no influence of electrostriction, and an intrinsic $d_{33}$ of the piezoelectric composition is obtained. The $d_{33}$ of Example A1 is shown in the following Table 1.

A piezoelectric device was prepared by forming electrodes on both surfaces of the piezoelectric composition after the polarization treatment. The whole of the piezoelectric device was placed in a thermostatic chamber. The depolarization temperature $T_d$ (unit: ° C.) of the piezoelectric composition was specified by continuously measuring the piezoelectric constant ($d_{33}$) of the piezoelectric composition while the temperature of the piezoelectric device in the thermostatic chamber was raised from room temperature. The depolarization temperature $T_d$ is a temperature of the piezoelectric composition at the moment the $d_{33}$ of the piezoelectric composition becomes zero in the temperature-rising process. An impedance analyzer was used for the measurement of the $d_{33}$. The $T_d$ of Example A1 is shown in the following Table 1.

Examples A2 to A10, B1 to B15, C1 to C15, D1 to D15 and E1 to E11, and Comparative Examples 1 to 5

In the cases of Examples A2 to A10, B1 to B15, C1 to C15, D1 to D15 and E1 to E11, and Comparative Examples 1 to 5, x, y, m and n were adjusted to values shown in the following Tables 1 to 5 by weighing of starting materials.

In the cases of Examples A2 to A10, B1 to B15, C1 to C15, D1 to D15 and E1 to E11, and Comparative Examples 1 to 5, the temperature-rising rate $V_T$, the first sintering temperature $T_{S1}$ and the second sintering temperature $T_{S2}$ were values shown in the following Tables 1 to 5.

Respective piezoelectric compositions of the above Examples and Comparative Examples were fabricated by the same method as in Example A1, except for the above items. Analysis and measurement were carried out by the same method as in Example A1 on the respective piezoelectric compositions of the above Examples and Comparative Examples.

In any case of Examples A2 to A10, B1 to B15, C1 to C15, D1 to D15 and E1 to E11, and Comparative Examples 1 to 5, the molar ratios of Bi, Fe, Ba and Ti of the piezoelectric composition coincided with the molar ratios of Bi, Fe, Ba and Ti in the Chemical Formula 1, and the values of x, y, m and n in the Chemical Formula 1 coincided with values shown in the following Tables 1 to 5.

Figure 6:
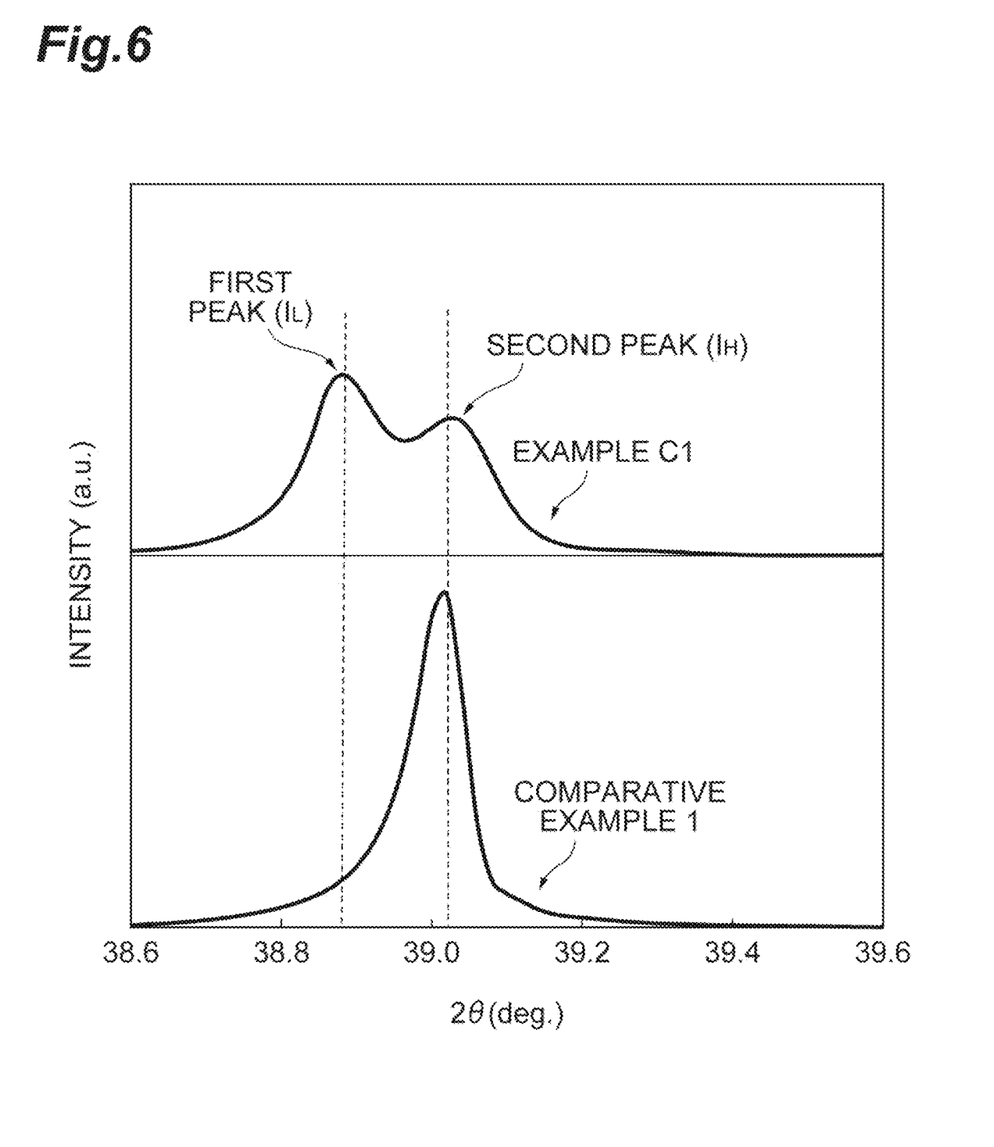
FIG. 6 is an X-ray diffraction pattern of a piezoelectric composition of Example C1 of the present invention, and an X-ray diffraction pattern of a piezoelectric composition of Comparative Example 1.

In any case of Examples A2 to A10, B1 to B15, C1 to C15, D1 to D15 and E1 to E11, and Comparative Examples 1 to 5, it was confirmed that the piezoelectric composition had a perovskite structure. In all cases of Examples and Comparative Examples except Comparative Example 1, the X-ray diffraction pattern had a first peak and a second peak in the range of the diffraction angle 2θ of 38.6° or more and 39.6° or less, and the diffraction angle 2θ of the first peak was smaller than the diffraction angle 2θ of the second peak. Respective $I_H/I_L$ of Examples and Comparative Examples except Comparative Example 1 are shown in the following Tables 1 to 5. The X-ray diffraction patterns of Example C1 and Comparative Example 1 are shown in FIG. 6. As shown in FIG. 6, the X-ray diffraction pattern of Comparative Example 1 had no first peak. That is, $I_L$ of Comparative Example 1 was zero. Therefore, it was impossible to calculate $I_H/I_L$ of Comparative Example 1.

In the cases of Examples A2 to A10, B1 to B15, C1 to C15, D1 to D15 and E1 to E11, and Comparative Examples 1 to 5, $d_{33}$ and $T_d$ were values shown in the following Tables 1 to 5. It is preferable that $d_{33}$ is 100 pC/N or more, and it is more preferable that $d_{33}$ is 200 pC/N or more. It is preferable that $T_d$ is 260° C. or more, and it is more preferable that $T_d$ is 300° C. or more.

TABLE 1

|  | $I_H/I_L$ | x | y | m | n | $V_T$ (° C./min) | $T_{S1}$ (° C.) | $T_{S2}$ (° C.) | $d_{33}$ (pC/N) | $T_d$ (° C.) |
|---|---|---|---|---|---|---|---|---|---|---|
| Comparative Example 1 | — | 0.9 | 0.1 | 1.00 | 1.00 | 5 | 850 | 850 | 15 | 651 |
| Comparative Example 2 | 7.60 | 0.8 | 0.2 | 1.00 | 1.00 | 5 | 900 | 900 | 43 | 581 |
| Comparative Example 3 | 3.80 | 0.7 | 0.3 | 1.00 | 1.00 | 5 | 1000 | 1000 | 80 | 450 |
| Comparative Example 4 | 3.00 | 0.6 | 0.4 | 1.00 | 1.00 | 5 | 1100 | 1100 | 62 | 363 |
| Comparative Example 5 | 2.50 | 0.5 | 0.5 | 1.00 | 1.00 | 5 | 1150 | 1150 | 20 | 281 |
| Example A1 | 1.52 | 0.9 | 0.1 | 0.93 | 1.00 | 300 | 1100 | 900 | 102 | 623 |
| Example A2 | 1.43 | 0.9 | 0.1 | 0.94 | 1.00 | 300 | 1100 | 900 | 103 | 643 |
| Example A3 | 1.38 | 0.9 | 0.1 | 1.00 | 1.00 | 300 | 1100 | 900 | 105 | 632 |
| Example A4 | 1.27 | 0.9 | 0.1 | 1.02 | 1.02 | 300 | 1100 | 900 | 111 | 612 |
| Example A5 | 1.33 | 0.9 | 0.1 | 1.06 | 1.00 | 300 | 1100 | 900 | 110 | 611 |
| Example A6 | 1.38 | 0.9 | 0.1 | 1.07 | 1.00 | 300 | 1100 | 900 | 108 | 631 |
| Example A7 | 1.49 | 0.9 | 0.1 | 1.00 | 0.93 | 300 | 1100 | 900 | 107 | 612 |
| Example A8 | 1.46 | 0.9 | 0.1 | 1.00 | 0.94 | 300 | 1100 | 900 | 102 | 633 |
| Example A9 | 1.38 | 0.9 | 0.1 | 1.00 | 1.06 | 300 | 1100 | 900 | 106 | 624 |
| Example A10 | 1.41 | 0.9 | 0.1 | 1.00 | 1.07 | 300 | 1100 | 900 | 104 | 619 |

TABLE 2

|  | $I_H/I_L$ | x | y | m | n | $V_T$ (° C./min) | $T_{S1}$ (° C.) | $T_{S2}$ (° C.) | $d_{33}$ (pC/N) | $T_d$ (° C.) |
|---|---|---|---|---|---|---|---|---|---|---|
| Example B1 | 1.33 | 0.8 | 0.2 | 0.93 | 1.00 | 300 | 1150 | 950 | 150 | 571 |
| Example B2 | 1.28 | 0.8 | 0.2 | 0.94 | 1.00 | 300 | 1150 | 950 | 160 | 568 |
| Example B3 | 1.14 | 0.8 | 0.2 | 1.00 | 1.00 | 300 | 1150 | 950 | 152 | 558 |
| Example B4 | 1.13 | 0.8 | 0.2 | 1.06 | 1.00 | 300 | 1150 | 950 | 160 | 551 |
| Example B5 | 1.23 | 0.8 | 0.2 | 1.07 | 1.00 | 300 | 1150 | 950 | 164 | 557 |
| Example B6 | 1.28 | 0.8 | 0.2 | 1.00 | 0.93 | 300 | 1150 | 950 | 155 | 558 |
| Example B7 | 1.27 | 0.8 | 0.2 | 1.00 | 0.94 | 300 | 1150 | 950 | 162 | 546 |
| Example B8 | 1.12 | 0.8 | 0.2 | 1.00 | 1.06 | 300 | 1150 | 950 | 158 | 546 |
| Example B9 | 1.23 | 0.8 | 0.2 | 1.00 | 1.07 | 300 | 1150 | 950 | 163 | 541 |
| Example B10 | 1.11 | 0.8 | 0.2 | 1.02 | 1.02 | 300 | 1150 | 950 | 166 | 561 |
| Example B11 | 1.10 | 0.8 | 0.2 | 1.04 | 1.04 | 15 | 1100 | 1000 | 165 | 571 |
| Example B12 | 1.06 | 0.8 | 0.2 | 1.04 | 1.04 | 15 | 1100 | 900 | 201 | 569 |
| Example B13 | 1.05 | 0.8 | 0.2 | 1.04 | 1.04 | 300 | 1200 | 950 | 203 | 567 |
| Example B14 | 1.06 | 0.8 | 0.2 | 1.04 | 1.04 | 1000 | 1300 | 1000 | 202 | 571 |
| Example B15 | 1.12 | 0.8 | 0.2 | 1.05 | 1.05 | 300 | 1200 | 950 | 167 | 539 |

TABLE 3

|  | $I_H/I_L$ | x | y | m | n | $V_T$ (° C./min) | $T_{S1}$ (° C.) | $T_{S2}$ (° C.) | $d_{33}$ (pC/N) | $T_d$ (° C.) |
|---|---|---|---|---|---|---|---|---|---|---|
| Example C1 | 0.76 | 0.7 | 0.3 | 0.93 | 1.00 | 300 | 1200 | 950 | 170 | 437 |
| Example C2 | 0.72 | 0.7 | 0.3 | 0.94 | 1.00 | 300 | 1200 | 950 | 169 | 436 |
| Example C3 | 0.73 | 0.7 | 0.3 | 1.00 | 1.00 | 300 | 1200 | 950 | 195 | 441 |
| Example C4 | 0.72 | 0.7 | 0.3 | 1.06 | 1.00 | 300 | 1200 | 950 | 197 | 428 |
| Example C5 | 0.72 | 0.7 | 0.3 | 1.07 | 1.00 | 300 | 1200 | 950 | 178 | 437 |
| Example C6 | 0.71 | 0.7 | 0.3 | 1.00 | 0.93 | 300 | 1200 | 950 | 163 | 429 |
| Example C7 | 0.68 | 0.7 | 0.3 | 1.00 | 0.94 | 300 | 1200 | 950 | 180 | 419 |
| Example C8 | 0.67 | 0.7 | 0.3 | 1.00 | 1.06 | 300 | 1200 | 950 | 194 | 423 |
| Example C9 | 0.64 | 0.7 | 0.3 | 1.00 | 1.07 | 300 | 1200 | 950 | 185 | 433 |
| Example C10 | 0.67 | 0.7 | 0.3 | 1.02 | 1.02 | 300 | 1200 | 950 | 216 | 426 |
| Example C11 | 0.67 | 0.7 | 0.3 | 1.04 | 1.04 | 15 | 1100 | 1000 | 220 | 427 |
| Example C12 | 0.53 | 0.7 | 0.3 | 1.04 | 1.04 | 15 | 1100 | 900 | 245 | 431 |
| Example C13 | 0.49 | 0.7 | 0.3 | 1.04 | 1.04 | 300 | 1200 | 950 | 250 | 433 |
| Example C14 | 0.49 | 0.7 | 0.3 | 1.04 | 1.04 | 1000 | 1300 | 1000 | 248 | 429 |
| Example C15 | 0.55 | 0.7 | 0.3 | 1.05 | 1.05 | 300 | 1200 | 950 | 218 | 419 |

TABLE 4

|  | $I_H/I_L$ | x | y | m | n | $V_T$ (° C./min) | $T_{S1}$ (° C.) | $T_{S2}$ (° C.) | $d_{33}$ (pC/N) | $T_d$ (° C.) |
|---|---|---|---|---|---|---|---|---|---|---|
| Example D1 | 1.14 | 0.6 | 0.4 | 0.93 | 1.00 | 300 | 1250 | 950 | 182 | 354 |
| Example D2 | 1.12 | 0.6 | 0.4 | 0.94 | 1.00 | 300 | 1250 | 950 | 191 | 347 |
| Example D3 | 1.11 | 0.6 | 0.4 | 1.00 | 1.00 | 300 | 1250 | 950 | 188 | 341 |
| Example D4 | 1.11 | 0.6 | 0.4 | 1.06 | 1.00 | 300 | 1250 | 950 | 161 | 339 |
| Example D5 | 1.10 | 0.6 | 0.4 | 1.07 | 1.00 | 300 | 1250 | 950 | 166 | 335 |
| Example D6 | 1.15 | 0.6 | 0.4 | 1.00 | 0.93 | 300 | 1250 | 950 | 183 | 327 |
| Example D7 | 1.13 | 0.6 | 0.4 | 1.00 | 0.94 | 300 | 1250 | 950 | 191 | 354 |
| Example D8 | 1.12 | 0.6 | 0.4 | 1.00 | 1.06 | 300 | 1250 | 950 | 165 | 344 |
| Example D9 | 1.09 | 0.6 | 0.4 | 1.00 | 1.07 | 300 | 1250 | 950 | 171 | 329 |
| Example D10 | 1.06 | 0.6 | 0.4 | 1.02 | 1.02 | 300 | 1250 | 950 | 193 | 347 |
| Example D11 | 1.06 | 0.6 | 0.4 | 1.04 | 1.04 | 15 | 1100 | 1000 | 200 | 346 |
| Example D12 | 1.05 | 0.6 | 0.4 | 1.04 | 1.04 | 15 | 1100 | 900 | 231 | 348 |
| Example D13 | 1.05 | 0.6 | 0.4 | 1.04 | 1.04 | 300 | 1200 | 950 | 241 | 342 |
| Example D14 | 1.05 | 0.6 | 0.4 | 1.04 | 1.04 | 1000 | 1300 | 1000 | 239 | 345 |
| Example D15 | 1.06 | 0.6 | 0.4 | 1.05 | 1.05 | 300 | 1200 | 1100 | 198 | 351 |

TABLE 5

|  | $I_H/I_L$ | x | y | m | n | $V_T$ (° C./min) | $T_{S1}$ (° C.) | $T_{S2}$ (° C.) | $d_{33}$ (pC/N) | $T_d$ (° C.) |
|---|---|---|---|---|---|---|---|---|---|---|
| Example E1 | 1.26 | 0.5 | 0.5 | 0.93 | 1.00 | 300 | 1300 | 1000 | 150 | 260 |
| Example E2 | 1.23 | 0.5 | 0.5 | 0.94 | 1.00 | 300 | 1300 | 1000 | 163 | 267 |
| Example E3 | 1.17 | 0.5 | 0.5 | 1.00 | 1.00 | 300 | 1300 | 1000 | 168 | 265 |
| Example E4 | 1.10 | 0.5 | 0.5 | 1.02 | 1.02 | 300 | 1300 | 1000 | 155 | 271 |
| Example E5 | 1.12 | 0.5 | 0.5 | 1.06 | 1.00 | 300 | 1300 | 1000 | 162 | 268 |
| Example E6 | 1.13 | 0.5 | 0.5 | 1.07 | 1.00 | 300 | 1300 | 1000 | 166 | 264 |
| Example E7 | 1.18 | 0.5 | 0.5 | 1.00 | 0.93 | 300 | 1300 | 1000 | 159 | 264 |
| Example E8 | 1.16 | 0.5 | 0.5 | 1.00 | 0.94 | 300 | 1300 | 1000 | 159 | 264 |
| Example E9 | 1.15 | 0.5 | 0.5 | 1.00 | 1.06 | 300 | 1300 | 1000 | 155 | 271 |
| Example E10 | 1.14 | 0.5 | 0.5 | 1.00 | 1.07 | 300 | 1300 | 1000 | 162 | 273 |
| Example E11 | 0.10 | 0.4 | 0.6 | 1.00 | 1.00 | 300 | 1300 | 1000 | 170 | 200 |

INDUSTRIAL APPLICABILITY

The piezoelectric composition according to the present invention is used, for example, for a piezoelectric actuator.

REFERENCE SIGNS LIST

2 . . . SUBSTRAFE, 4 . . . FIRST ELECTRODE, 6 . . . PIEZOELECTRIC BODY (PIEZOELECTRIC COMPOSITION), 8 . . . SECOND ELECTRODE, uc . . . UNIT CELL OF PEROVSKITE STRUCTURE.

What is claimed is:

1. A piezoelectric composition comprising an oxide having a perovskite structure,
wherein the oxide contains bismuth, barium, iron and titanium;
at least part of the oxide is represented by $x[Bi_mFeO_3]\text{-}y[Ba_nTiO_3]$;
x is 0.4 or more and 0.8 or less;
y is 0.2 or more and 0.6 or less;
x+y is 1;
m is 0.96 or more and 1.06 or less;
n is 0.96 or more and 1.06 or less
an X-ray diffraction pattern of the piezoelectric composition after a polarization treatment has a first peak and a second peak in the range of a diffraction angle 2θ of 38.6° or more and 39.6° or less;
the diffraction angle 2θ of the first peak is smaller than the diffraction angle 2θ of the second peak;
an intensity of the first peak is represented as $I_L$;
an intensity of the second peak is represented as $I_H$;
$I_H/I_L$ is 0.10 or more and 1.33 or less; and
a piezoelectric constant $d_{33}$ of the piezoelectric composition is 150 pC/N or more.

2. The piezoelectric composition according to claim 1, wherein
m is 1.02 or more and 1.05 or less; and
n is 1.02 or more and 1.05 or less.

3. The piezoelectric composition according to claim 1, wherein at least part of the oxide is a rhombohedral crystal.

4. The piezoelectric composition according to claim 1, comprising a rhombohedral crystal of an oxide containing bismuth and iron.

5. A piezoelectric device comprising the piezoelectric composition according to claim 1.

6. The piezoelectric composition according to claim 1, wherein a depolarization temperature $T_d$ is a temperature of the piezoelectric composition at the moment when the piezoelectric constant $d_{33}$ of the piezoelectric composition after the polarization treatment becomes zero in a temperature-rising process, and
the depolarization temperature $T_d$ is 200° C. or more.

* * * * *